(12) United States Patent
Ottliczky

(10) Patent No.: US 6,173,731 B1
(45) Date of Patent: Jan. 16, 2001

(54) ELECTROFLUIDIC MODULAR SYSTEM

(75) Inventor: Martin Ottliczky, Forchtenberg (DE)

(73) Assignee: Burkert Werke GmbH & Co., Ingelfingen (DE)

(*) Notice: Under 35 U.S.C. 154(b), the term of this patent shall be extended for 0 days.

(21) Appl. No.: 09/446,315
(22) PCT Filed: Apr. 6, 1999
(86) PCT No.: PCT/EP99/02589
§ 371 Date: Dec. 20, 1999
§ 102(e) Date: Dec. 20, 1999
(87) PCT Pub. No.: WO99/54632
PCT Pub. Date: Oct. 28, 1999

(30) Foreign Application Priority Data

Apr. 20, 1998 (DE) .............................. 298 07 097

(51) Int. Cl.[7] .............................. F15B 13/08; F15B 21/08
(52) U.S. Cl. ..................... 137/271; 137/560; 137/884
(58) Field of Search .................... 137/271, 269, 137/884, 270, 560

(56) References Cited

U.S. PATENT DOCUMENTS 5,519,636  5/1996  Stoll et al. .
5,529,088 * 6/1996  Asou .............................. 137/271 X
5,918,629 * 7/1999  Hayashi et al. .................. 137/270 X
5,950,661 * 9/1999  Kirchhoff-Stewens .......... 137/271 X

FOREIGN PATENT DOCUMENTS 683 021 A5   12/1993  (CH) .
0 624 832 A2  2/1994  (EP) .
0 621 407 A1  3/1994  (EP) .
0 703 391 A1  8/1995  (EP) .

* cited by examiner

Primary Examiner—Kevin Lee
(74) Attorney, Agent, or Firm—Nixon Peabody LLP; Stuart J. Friedman

(57) ABSTRACT

An electrofluidic modular system (1) is made up of modules which are secured to a bar (5) and may be mounted one after the other, in particular fluidic modules (9) having collecting channels (10, 11, 12) for actuator ports (26, 27, 28), electric modules (7) including bus terminals (8) and electric terminals (44) for actuators (15), and function modules (30). Two interface modules (18, 19) each have on one connecting side (23) a first connecting configuration with electric (8) and fluidic (10, 11, 12) terminals and with a contour (24) which are adapted to the modules (7, 9) of the modular system (1), and have on the opposite connecting side (22) a second connecting configuration which is different from the first and has electric (25) terminals and a contour (20) which are adapted to modules (2, 3) of a modular system of a different provider secured to the same bar (5).

11 Claims, 1 Drawing Sheet

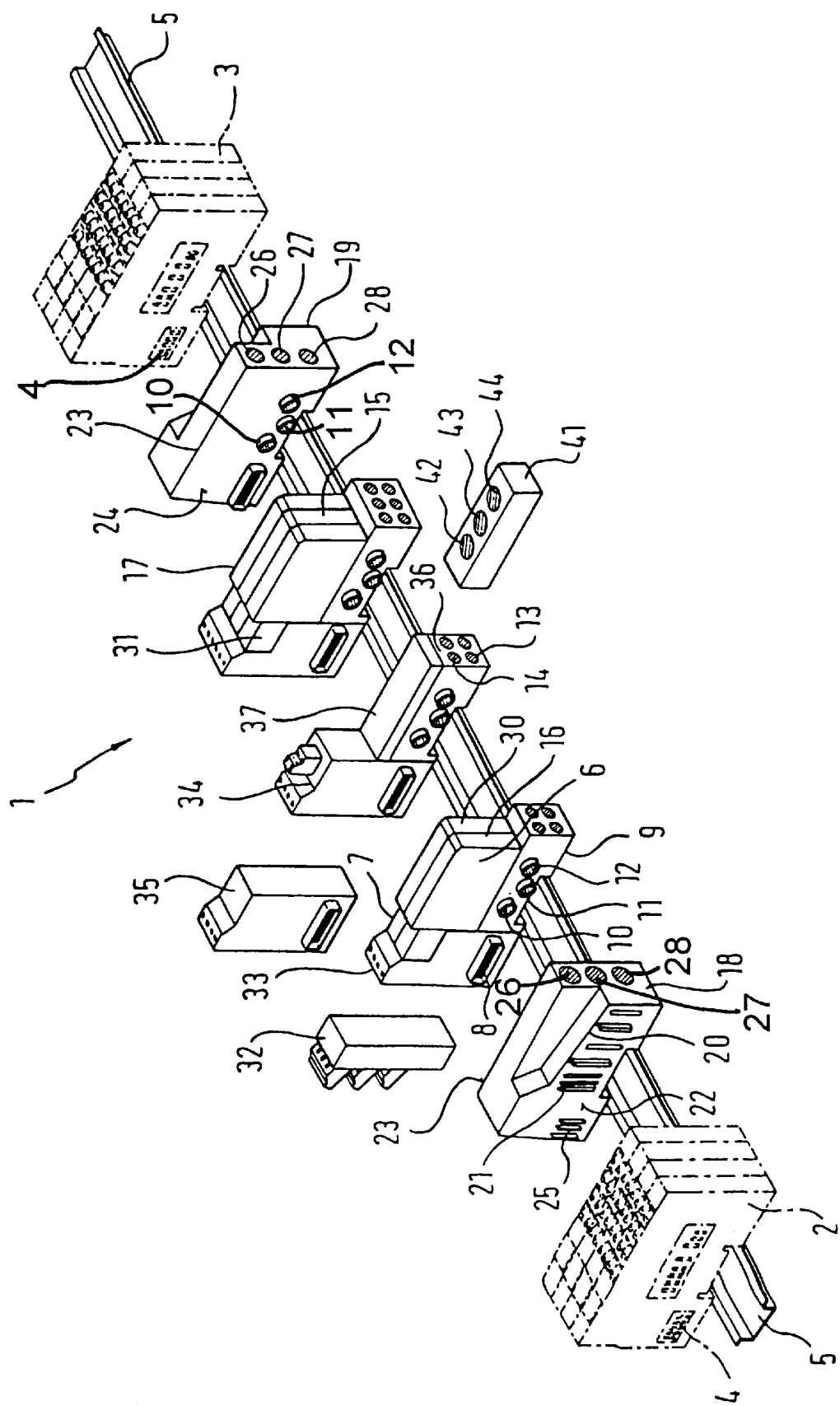

ELECTROFLUIDIC MODULAR SYSTEM

FIELD OF THE INVENTION

The invention relates to an electrofluidic modular system.

The electrofluidic part of such modular system consists of a controlling external bus or multipole terminal and an internal bus, with electric relaying by wiring or circuit boards.

BACKGROUND OF THE INVENTION

By conventional means, electric input/output blocks and fluidic blocks of differing manufacturers are implemented and wired on separate bars. The fluidic ports are not directly linked to the bus system, i.e. they are signaled via the electric input/output blocks of other manufacture.

Since the interfaces of the modules are not subject to any standard, each manufacturer realizes his own concept. This results in added costs and labor when use is made of electric and fluidic components of differing manufacturers in a single system, the wiring being just as much an expensive item as is the fact that exchanging the components necessitates qualified specialist personnel. As a result of this, the costs of installing and servicing such a system are high.

In fluidic systems the users need a system to be fed with differing pressures. In conventional systems this problem can only be solved at high cost and labor expenditure.

SUMMARY OF THE INVENTION

The invention provides an electrofluidic modular system which may be directly integrated in the electric system of other manufacture made up of electric input/output modules. The modular system in accordance with the invention is defined in claim 1. One preferred embodiment is, for the purpose of controlling the actuators, directly integrated in an external bus system, e.g. AS-I, Interbus-S etc. for the transfer of the control and data signals to and from the controller. For this purpose the electric standard module of the electrofluidic modular system comprises a protocol chip with which it communicates with the controller. Further embodiments are connected to line group or multipole modules and are powered via an internal bus, via circuit boards and/or wiring and/or are able to transfer data. The module width may vary in accordance with the invention in a grid dictated by the actuators, single modules with a single actuator and multiple modules with two, three or more actuators being possible.

In a further development of the invention each electrofluidic module may be interconnected with an emergency OFF module. For this purpose a special feeder module is integrated which, when necessary, disconnects or adds on the function of individual actuators or of any number thereof by means of, for example, a mechanical safety relay with forced coupling.

The modular system in accordance with the invention comprises at least one, but as a rule two mirror-inverted interface modules to the electric modules of other manufacture. This interface module preferably contains a circuit board with terminal contacts on both sides in adaptation to the contacts of the various manufacturers. The interface module is connected to the module of other manufacture as specified by the manufacturer, e.g. by means of latch, screw or plug-in type connections. On the electrofluidic side any desired electrofluidic module of the modular system may be mounted, preferably by latching elements.

Furthermore, the interface module comprises in a preferred embodiment the ports and channels for the fluidic infeed of the adjoining fluidic modules and their actuators.

A standard electrofluidic module which may be used in the modular system in accordance with the invention is preferably composed of three parts, namely a fluidic part comprising the collecting conduits for the P, R and S ports, an electric part in which the internal or external bus runs and which is equipped with a protocol chip for communication with the controller, as well as a function part including the actuators, e.g. valves or actuating drives.

Splitting up the standard electrofluidic module preferably into three parts, namely an electric, a fluidic and a function part, provides furthermore the advantage of standardization of the parts in terms of production engineering, so that a few sub-modules suffice to permit achieving a large number of functions, thus making it easy, e.g. merely by changing the electric module, to adjust the system to various internal or external bus protocols or, in conjunction with a line group module or multipole module, to provide the power for switching the actuators in electric modules.

By reconfiguring and varying the composition of the sub-modules, further functions are possible in accordance with the invention, this being in the case of the electric modules e.g. an electric bypass which simply passes on the bus or the operating and control voltage to the adjoining electric modules, or a module for supplying external emergency OFF signals. These may have components assigned to them in the fluidic part which require no electric connection, e.g. a fluidic bulkhead, a fluidic interfeed or a fluidic module having a blind plate to bypass one or more modules without function modules.

It has further proven to be of particular advantage to combine the fluidic bulkhead with an interfeed, this combination enabling differing pressures to be fed into the system.

In a further development of the invention, provision is furthermore made for a feedback module which may be directly coupled to the electrofluidic module, this having the advantage that the user is now able to directly assign the feedback, e.g. by LEDs, to the actuator function by simple ways and means.

BRIEF DESCRIPTION OF THE DRAWING

The invention will now be described in more detail by way of an embodiment as shown in the drawing.

The single FIGURE is a schematic exploded view of one embodiment of an electrofluidic block between two electric input/output modules.

DESCRIPTION OF THE PREFERRED EMBODIMENT

In the FIGURE there is illustrated one possible variant of the electrofluidic modular system 1 inserted between two input/output modules 2, 3 of other manufacture and an external bus 4. All modules are secured to a standard bar 5 and arranged juxtaposed starting from one side. Electric modules 7 have a bus interface 8 specified by the manufacturer. Fluidic modules 9 comprise fluidic collecting channels 10, 11, 12 as well as two fluidic outputs 13, 14 for each actuator 15. The modules 6 are represented as multiple modules 16, 17 having two and three actuators 15, respectively.

The input/output module 2 of other manufacture is secured to the bar 5. In its contour 20 as well as electric terminals 21 and bus interface 25 on one connecting side 22, an interface module 18 shown on the left-hand side is adapted to the input/output module 2 of other manufacture and is connected thereto. The opposite connecting side 23 of the interface module 18 comprises the contour 24 and bus interface 8 matching with the electrofluidic modular system 1. The fluidic infeed (not shown) is effected at ports 26, 27, 28 of the interface module 18.

A duplex module 16 adjoining the interface module 18 is made up of the electric part 7, fluidic part 9 and function part 30. It has the width of a duplex function part 30 with two connected actuators 15, the fluidic outputs 13, 14 thereof in the fluidic module 9 and the electric switching units 31 thereof with the connections to the bus 4. The fluidic part 9 comprises collecting channels 10, 11, 12 as well as the actuator outputs 13, 14 and actuator inputs (not shown). Assigned to the electric module 7 is a feedback module 32 which is preferably latched by its rear side 33 to the electric module 7.

Adjoining, an electrofluidic unit without function module 30 is illustrated. A module 34 with electric emergency OFF supply may be exchanged by an electric bypass 35. In a fluidic bulkhead element 36, the three fluidic channels 10, 11, 12 are sealed off from the adjoining triple unit 17. A blind plate 37 closes off the fluidic ports located beneath. For an intermediate pressure infeed, the blind plate 37 may be replaced by the fluidic infeed element 41 having the ports 42, 43, 44.

The adjoining triple unit 17 differs from the double unit 16 merely in width, it having the width of a triple function module 30, i.e. with three connected actuators 15.

The terminating electrofluidic interface module 19 is mirror-inverted to the interface 18, terminates the electrofluidic modular system 1 and connects it to the input/output module 2 of other manufacture.

What is claimed is:

1. An electrofluidic modular system made up of modules which are secured to a bar and may be mounted one after the other, comprising fluidic modules having collecting channels for actuator ports, electric modules including bus terminals and electric terminals for actuators, and function modules, the modular system providing at least one interface module is which has on one connecting side a first connecting configuration with electric and fluidic terminals and with a contour which are adapted to the modules of the modular system, and has on the opposite connecting side a second connecting configuration which is different from the first and has electric terminals and a contour which are adapted to modules of a modular system of a different provider secured to the same bar, the modular system comprising an internal bus which is an extension of an external bus of the modular system of the different provider.

2. The electrofluidic modular system as set forth in claim 1, wherein the modules thereof are arranged between two interface modules having mirror-inverted connecting sides.

3. The electrofluidic modular system as set forth in claim 1, wherein the actuators of the modular system are connectable to a line group.

4. The electrofluidic modular system as set forth in claim 1, wherein an electric module of the modular system is an emergency OFF module.

5. The electrofluidic modular system as set forth in claim 1, wherein the actuator ports and the collecting channels are integrated in the interface module.

6. The electrofluidic modular system as set forth in claim 5, wherein a fluidic module comprises the actuator ports and the collecting channels.

7. The electrofluidic modular system as set forth in claim 1, wherein in a fluidic module the collecting channels are closed off on one side by a blind plate.

8. The electrofluidic modular system as set forth in claim 1, wherein a feedback module directly assigned to the actuators is connected to the electric module.

9. The electrofluidic modular system as set forth in claim 1, wherein the system comprises standard electrofluidic modules which are split up into a fluidic part, an electric part and a function part.

10. The electrofluidic modular system as set forth in claim 9, wherein the parts of the standard electrofluidic module are for their part modular and interchangeable.

11. An electrofluidic modular system made up of modules which are secured to a bar and may be mounted one after the other, comprising fluidic modules having collecting channels for actuator ports, electric modules including bus terminals and electric terminals for actuators, and function modules, the modular system providing at least one interface module which has on one connecting side a first connecting configuration with electric and fluidic terminals and with a contour which are adapted to the modules of the modular system, and has on the opposite connecting side a second connecting configuration which is different from the first and has electric terminals and a contour which are adapted to modules of a modular system of a different provider secured to the same bar, the interface module being equipped with electronic circuits which convert a signal protocol for the first connecting configuration into a signal protocol for the second connecting configuration and vice-versa.

* * * * *

UNITED STATES PATENT AND TRADEMARK OFFICE
CERTIFICATE OF CORRECTION

PATENT NO.    : 6,173,731 B1
DATED         : January 16, 2001
INVENTOR(S)   : Marin Ottliczky It is certified that error appears in the above-identified patent and that said Letters Patent is hereby corrected as shown below:

<u>Title page,</u>
Item [22], amend to read as follows:
-- [22]    PCT Filed:    Apr. 16, 1999 --.

Signed and Sealed this

Sixth Day of January, 2004

JAMES E. ROGAN
*Director of the United States Patent and Trademark Office*